(12) United States Patent
Bajic et al.

(10) Patent No.: US 10,132,534 B2
(45) Date of Patent: Nov. 20, 2018

(54) ELECTROTHERMAL TRANSDUCER, AND TEMPERATURE CONTROLLING DEVICE

(71) Applicant: GENTHERM GMBH, Odelzhausen (DE)

(72) Inventors: Goran Bajic, Belle River (CA); Syed Iqbal, Tecumseh (CA); Dmitri Axakov, Waterloo (CA); Tim Normand, Lasalle (CA)

(73) Assignee: GENTHERM GMBH, Odelzhauzen (DE)

( * ) Notice: Subject to any disclaimer, the term of this patent is extended or adjusted under 35 U.S.C. 154(b) by 526 days.

(21) Appl. No.: 14/837,657

(22) Filed: Aug. 27, 2015

(65) Prior Publication Data
US 2015/0369523 A1    Dec. 24, 2015

Related U.S. Application Data

(63) Continuation of application No. 12/674,533, filed as application No. PCT/DE2008/001374 on Aug. 22, 2008, now Pat. No. 9,172,023.

(30) Foreign Application Priority Data

Aug. 24, 2007   (DE) .................. 10 2007 040 264
Nov. 9, 2007    (DE) .................. 10 2007 053 869
Dec. 12, 2007   (DE) .................. 10 2007 060 312

(51) Int. Cl.
*B23K 15/02*   (2006.01)
*F25B 21/04*   (2006.01)
(Continued)

(52) U.S. Cl.
CPC ............ *F25B 21/04* (2013.01); *B60N 2/5678* (2013.01); *H01L 35/32* (2013.01)

(58) Field of Classification Search
CPC .......... B60H 1/2225; B60H 2201/2293; B60N 2/56; B60N 2/5678; B60N 2/5685; H05B 2203/029
(Continued)

(56) References Cited

U.S. PATENT DOCUMENTS 2,493,303 A   1/1950 McCullough
3,136,577 A   6/1964 Richard
(Continued)

FOREIGN PATENT DOCUMENTS

DE    34 38 266 A1    5/1985
DE    19503291 A1 *   8/1996    .............. A47C 7/74
(Continued)

OTHER PUBLICATIONS

International Search Report, Application No. PCT/DE2008/001374, dated Aug. 10, 2009, published as WO2009/026890A3.
(Continued)

*Primary Examiner* — Dana Ross
*Assistant Examiner* — Brandon Harvey
(74) *Attorney, Agent, or Firm* — The Dobrusin Law Firm, P.C.

(57) ABSTRACT

The present invention relates to an electrothermal converter, which has at least one cold side and one warm side. Provision is made that all the components of the converter cope with the thermal loads appearing when the converter is operated and/or in particular maintains its mechanical stability.

19 Claims, 3 Drawing Sheets

Figure 1:
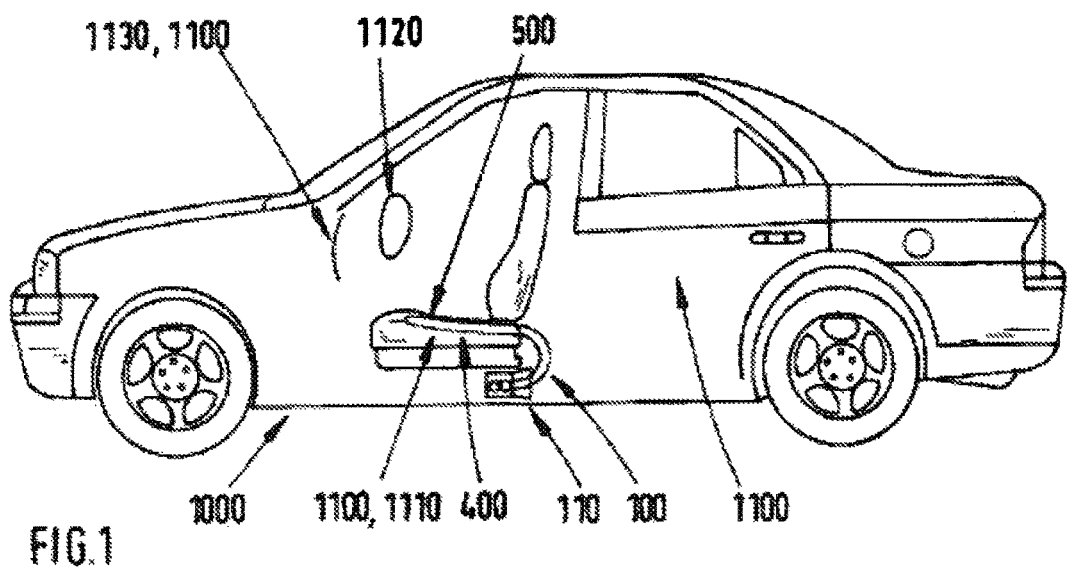

(51) Int. Cl.
*B60N 2/56* (2006.01)
*H01L 35/32* (2006.01)

(58) Field of Classification Search
USPC .................................................. 219/202, 217
See application file for complete search history.

(56) References Cited

U.S. PATENT DOCUMENTS

| | | |
|---|---|---|
| 3,552,133 A | 1/1971 | Lukomsky |
| 3,653,590 A | 4/1972 | Elsea |
| 3,681,797 A | 8/1972 | Messner |
| 3,684,170 A | 8/1972 | Roof |
| 4,043,544 A | 8/1977 | Ismer |
| 4,065,936 A | 1/1978 | Fenton et al. |
| 4,572,430 A | 2/1986 | Takagi et al. |
| 4,640,340 A | 2/1987 | Noda et al. |
| 4,665,707 A | 5/1987 | Hamilton |
| 4,777,802 A | 10/1988 | Feher |
| 5,002,336 A | 3/1991 | Feher |
| 5,106,161 A | 4/1992 | Meiller |
| 5,117,638 A | 6/1992 | Feher |
| 5,138,851 A | 8/1992 | Mardikian |
| 5,187,943 A | 2/1993 | Taniguchi et al. |
| 5,524,439 A | 6/1996 | Gallup et al. |
| 5,924,766 A | 7/1999 | Esaki et al. |
| 6,079,485 A | 6/2000 | Esaki et al. |
| 6,085,369 A | 7/2000 | Feher |
| 6,105,667 A | 8/2000 | Yoshinori et al. |
| 6,119,463 A | 9/2000 | Bell |
| 6,124,577 A | 9/2000 | Fristedt |
| 6,186,592 B1 | 2/2001 | Orizaris et al. |
| 6,223,539 B1 | 5/2001 | Bell |
| 6,237,675 B1 | 5/2001 | Oehring et al. |
| 6,254,179 B1 | 7/2001 | Kortume et al. |
| 6,263,530 B1 | 7/2001 | Feher |
| 6,273,181 B1 | 8/2001 | Matsui et al. |
| 6,278,090 B1 | 8/2001 | Fristedt et al. |
| 6,291,803 B1 | 9/2001 | Fourrey |
| 6,300,150 B1 | 10/2001 | Venkatasubramanian |
| 6,347,521 B1 | 2/2002 | Kadotani |
| 6,539,725 B2 | 4/2003 | Bell |
| RE38,128 E | 6/2003 | Gallup et al. |
| 6,598,405 B2 | 7/2003 | Bell |
| 6,606,866 B2 | 8/2003 | Bell |
| 6,619,736 B2 | 9/2003 | Stowe et al. |
| 6,625,990 B2 | 9/2003 | Bell |
| 6,637,210 B2 | 10/2003 | Bell |
| 6,664,518 B2 | 12/2003 | Fristedt et al. |
| 6,672,076 B2 | 1/2004 | Bell |
| 6,687,937 B2 | 2/2004 | Harker |
| 6,700,052 B2 | 3/2004 | Bell et al. |
| 6,719,624 B2 | 4/2004 | Hayashi et al. |
| 6,793,016 B2 | 9/2004 | Aoki et al. |
| 6,826,792 B2 | 12/2004 | Lin |
| 6,828,528 B2 | 12/2004 | Stöwe et al. |
| 6,848,742 B1 | 2/2005 | Aoki et al. |
| 6,886,352 B2 | 5/2005 | Yoshinori et al. |
| 6,957,545 B2 | 10/2005 | Aoki |
| 7,070,232 B2 | 7/2006 | Takeshi et al. |
| 7,231,772 B2 | 6/2007 | Bell et al. |
| 8,070,828 B2 | 12/2011 | Shannon |
| 2002/0017102 A1 | 2/2002 | Bell |
| 2002/0150478 A1 | 10/2002 | Aoki |
| 2003/0029173 A1 | 2/2003 | Bell et al. |
| 2003/0066554 A1* | 4/2003 | Feher ...................... H01L 35/30 136/200 |
| 2003/0230402 A1* | 12/2003 | Leitch ........................ F24J 2/07 165/178 |
| 2005/0126184 A1* | 6/2005 | Cauchy .................. F25B 21/02 62/3.3 |
| 2005/0257541 A1 | 11/2005 | Kadle et al. |
| 2006/0174633 A1 | 8/2006 | Beckley |
| 2007/0069554 A1 | 3/2007 | Comiskey et al. |
| 2007/0095378 A1 | 5/2007 | Ito et al. |

FOREIGN PATENT DOCUMENTS

| | | |
|---|---|---|
| DE | 10 2006 013 994 A1 | 10/2006 |
| DE | 60 2004 000 980 T2 | 12/2006 |
| DE | 11 2005 001 237 T5 | 4/2007 |
| DE | 102006050048 A1 | 5/2007 |
| GB | 1025687 A | 4/2003 |
| JP | 2005/333083 A | 12/2005 |
| JP | 2005333083 A * | 12/2005 |
| JP | 2006-234250 A | 7/2006 |
| SE | 0102983 | 3/2003 |
| WO | 04/114513 A1 | 12/2004 |

OTHER PUBLICATIONS

Translation of Written Opinion, Application No. PCT/DE2008/001374, dated Mar. 2, 2010.

Chinese Office Action, Application No. 200880110369.0 dated Aug. 9, 2011.

German Office Action, Application No. 102007060312.8 dated Nov. 16, 2010.

Japanese Office Action, Application No. 2010521300 dated Oct. 4, 2011.

* cited by examiner

ELECTROTHERMAL TRANSDUCER, AND TEMPERATURE CONTROLLING DEVICE

THEME OF THE INVENTION

An object of the present invention is an electrothermal converter according to the preamble of claim 1 (Electrothermal converter (112), which has at least one cold side (114) and one warm side (115), characterized in that all components of the converter (112) cope with thermal loads when the converter is operating and/or especially retain their mechanical stability). Such converters are often subjected to strong thermal loadings, such as temperature fluctuations, tensile stresses, etc. They also are under heavy pressure in terms of price.

SUBJECT OF THE INVENTION

Therefore a technical concept according to the independent claims is proposed. Additional advantageous embodiments can be gleaned from the following specification and the other claims.

The invention is especially advantageous in regard to manufacturing costs, safety and service life.

The invention is basically suited for all types of temperature control devices and their use in air conditioners, especially for all bolsters, especially motor vehicle seats, seat covers, paneling elements of passenger compartments, armchairs or office equipment, for example.

FIGURES

In what follows, the particulars of the invention are explained. These explanations should make the invention understandable. However, they are only of an exemplary nature. Naturally, within the framework of the invention, individual and multiple described features can also be omitted, altered or supplemented. Additionally, features of various embodiment forms can naturally be combined with each other. What is decisive is that the concept of the invention in essence is implemented. With this, "in essence" means in particular that the implementation results in the desired utility to a recognizable extent. In particular this may mean that a feature in question is at least 50%, 90%, 95% or 99% fulfilled.

Figure 5:
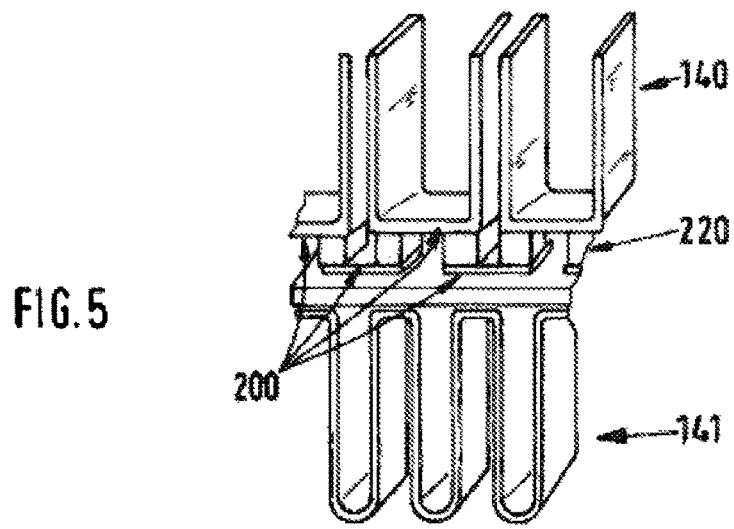
Figure 6:
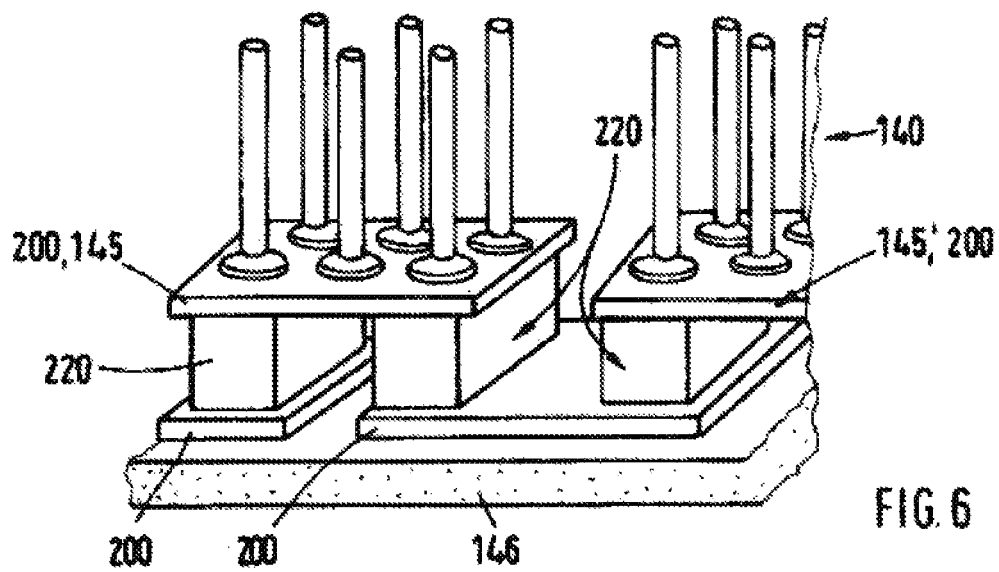
Figure 7:
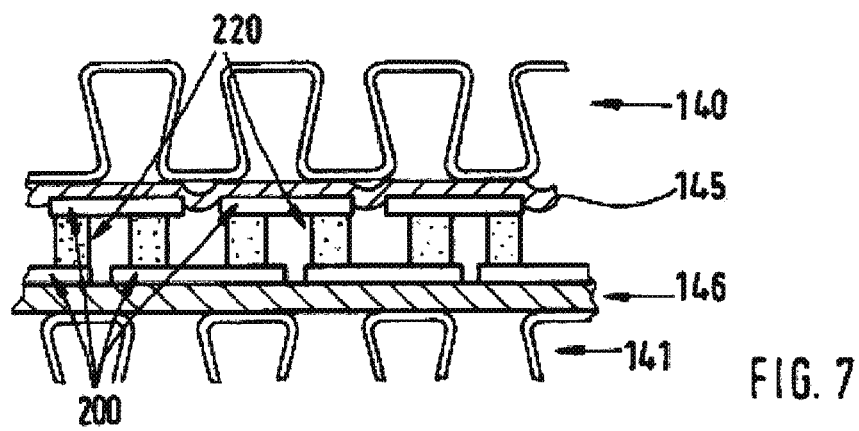

In what follows, reference will be made to:

FIG. 1. A motor vehicle in a partial longitudinal section with an air conditioner FIG. 2. Cross section through an electric converter and a temperature control device of the air conditioner from FIG. 1 with point connections between the individual components FIG. 3. Longitudinal section through a second embodiment form of a thermoelectric converter with corrugated-sheet heat exchangers FIG. 4. Perspective view of a third embodiment form of a thermoelectric converter with segmented heat exchangers FIG. 5. Perspective view of a fourth embodiment form of a thermoelectric converter with U-shaped bridge elements that also serve as heat exchangers FIG. 6. Perspective view of a fifth embodiment form of a thermoelectric converter with a multiplicity of thermally conducting ribs on the bridge elements FIG. 7. Longitudinal section through a sixth embodiment form of a thermoelectric converter with a ceramic and an elastic distributor plate FIG. 8. Perspective view of a seventh embodiment form of a thermoelectric converter with two corrugated sheet heat exchangers with differing orientation of their ribs

SPECIFICATION OF THE INVENTION

FIG. 1 shows a motor vehicle 1000. This can, for example, be an aircraft, an item of railway rolling stock, a ship or, as here, an automobile.

The vehicle 1000 has at least one interior item 1100. In doubtful instances this is meant to be all the components with which a user of the passenger compartment can come in contact, such as a steering mechanism 1120 for the vehicle, a dashboard 1130, an armrest 1140, a door panel 1150, a seat surface 1160, a thermal cover 1170, a vehicle headliner 1180, a bolster 400, a cover 500 or a seat 1110.

The interior item 1100 preferably has at least one bolster 400 and/or at least one cover 500.

The interior item 1100 preferably has at least one air conditioner 100. It is, for example, the temperature controller and air conditioner of surfaces in a vehicle touched by the user. It has at least one temperature control device 110, at least one air ducting device 120 and/or at least one humidity regulator 130. As a temperature controller 140 what is meant is every device that can be used for deliberate alteration of the temperature in its surroundings, for example, all devices with at least one electrical resistance heater, one heat pump, one Peltier element and/or one air circulator, such as a ventilator, or which in essence are formed from one. What is meant by an air circulator is every device that can be used for deliberate alteration of the air composition or of the air flows in a certain planar or three-dimensional area for air exchange, such as an onboard air conditioner, at least partially air-permeable spacer media, spacer textures and/or air conditioning inserts. What is meant by a humidity regulator 130 is a device that serves to regulate the air humidity in its environs, especially the specified temperature control devices 110, humidity absorbers such as activated charcoal fibers or polymeric superabsorbers.

The temperature control device 110 is attached via a connecting cable 119 to a current source 150.

An electrothermal converter 112 is a device for converting electrical energy into thermal energy and/or for generating a temperature gradient between two locations by means of electrical energy. Examples of this are Peltier elements.

Figure 2:
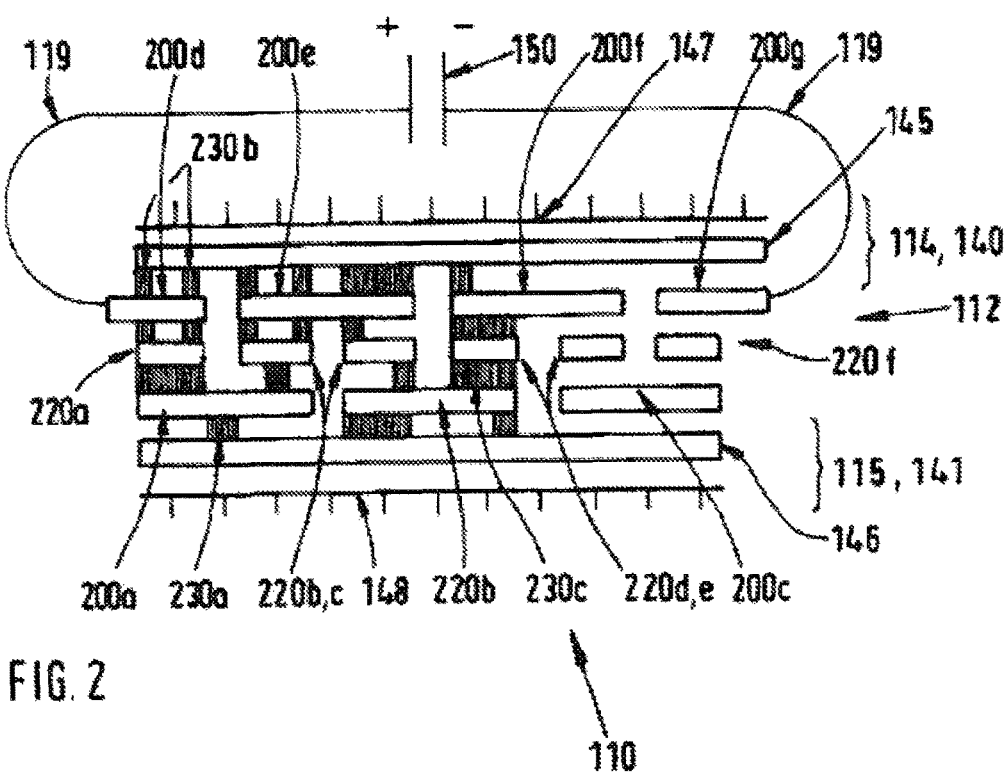
Figure 3:
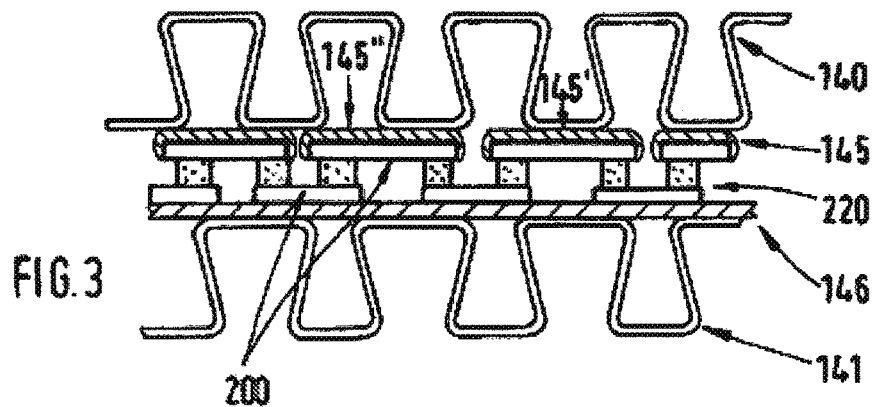

FIG. 2 shows a temperature controller 110 with an electrothermal converter 112 having at least two electrical semiconductor components 220 a-f. One semiconductor element is at least partially P doped, the other at least partially N doped. These are situated alternately and in sandwich fashion between bridge elements 200 a-g. By this means, an electrothermal converter 112 is created in a series connection of semiconductor components. If current flows through this arrangement, then one side of the semiconductor components becomes colder, and the other side warmer.

A cold side 114 is thus a side of the electrothermal converter 112 that is cooled when the converter operates. As the design dictates, this may always stay the same, or be capable of polar reversal depending on the current flow.

A warm side 115 is a side of the electrothermal converter 112 which is heated when the converter is in operation.

The semiconductor components 220 and the bridge elements 200 a-g can be joined by welding, soldering and/or gluing by an electrically conducting adhesive. This joining can occur over a full or broad surface, or partially and pointwise.

Thermally conducting adhesives are especially suited for bonding. These are materials that are good at conducting heat, to minimize transmission loss of the electrothermal converters 112 to the heat exchanger devices 140, 141 and to permit at least two objects to adhere at least slightly to each other. Examples of these are silicon-free thermally conducting pastes such as those based on synthetic fats with metallic admixtures like zinc oxide particles. Further examples are two-component adhesives such as epoxy-based ones. Additionally, PSA-based adhesives are suitable. The adhesives can be applied as fluid adhesives. But they also could be applied as an adhesive strip. An example is a thermally conducting PSA adhesive strip reinforced by an electrically conducting foil such as Kapton™. Additionally, waxes and resins could be considered, especially if they are mixed with metals or metal oxides. When components of temperature control device 110 are glued, preferably an adhesive is used that is still elastic and/or capable of creep. By this means, the semiconductor components obtain play to be able to stretch without tears or breaks.

It is also possible to assign bridge elements 200 in the form of conducting strips made of tin, copper, silver printing paste and/or electrically conducting adhesives.

The thermoelectric converter 112 preferably has a heat exchanger 140, 141 consisting of at least one cold or warm side 114, 115. Preferably at least a share of this is manufactured from a material with good thermal conductivity like aluminum or copper.

Figure 4:
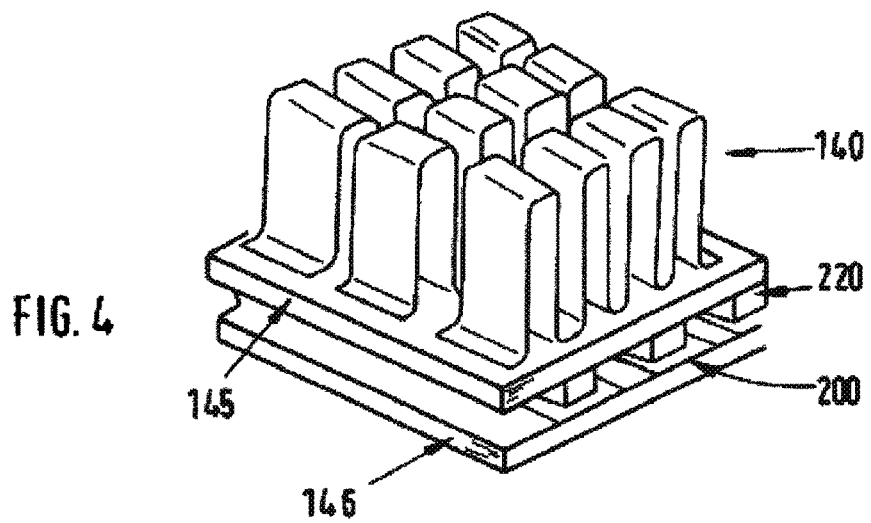

It can cover over all the semiconductor components 220 of the electrothermal converter 112 (FIG. 2). However, it could also be assigned only to certain semiconductor components (FIG. 4). In this case, preferably multiple heat exchangers are situated at intervals next to each other. Since these have mobility relative to each other, and exert no forces on each other, thermal stresses are thereby reduced. In the ideal case, one (FIG. 5) or more (FIG. 6) heat exchangers 140, 141 are assigned to each pair of semiconductor components 220 connected by a bridge element 200 a-g. The heat exchanger device can have a corrugated-sheet structure as in FIG. 3, and/or cooling ribs as in FIG. 2 and/or u-shaped profile bends as in FIG. 5. The heat exchangers of the cold and warm side 140, 141 can be configured in the same manner or differently.

To electrically insulate the semiconductor components 220 and the bridge elements 200 a-g from the heat exchangers 140, 141, for better distribution of mechanical loads, and for homogenizing of thermal flows, at least one distributor plate 145, 146 can be provided between at least one heat exchanger 140, 141 and at least one semiconductor component 220 or a bridge element 200 a-g. Provision can be made that distributor plates 145, 146 be situated that are identical or different from each other both on the hot and cold side.

At least one distributor plate 145, 146 is preferably made of a ceramic material. Especially favorable are DBC ceramics because they are more robust than traditional ceramic materials.

Provision can be made that at least one distributor plate 145, 146 can be made at least partially from Kapton. This material is a thermal conductor but an electrical insulator. It permits greater stretching of the electrothermal converter 112 than ceramic materials that are more brittle.

At least one distributor plate 146 is preferably made of a material that is more elastic than the material of at least one additional (such as the first) distributor plate 145. For this, a non-electrically-conducting polymer, for example, is suitable.

Figure 8:
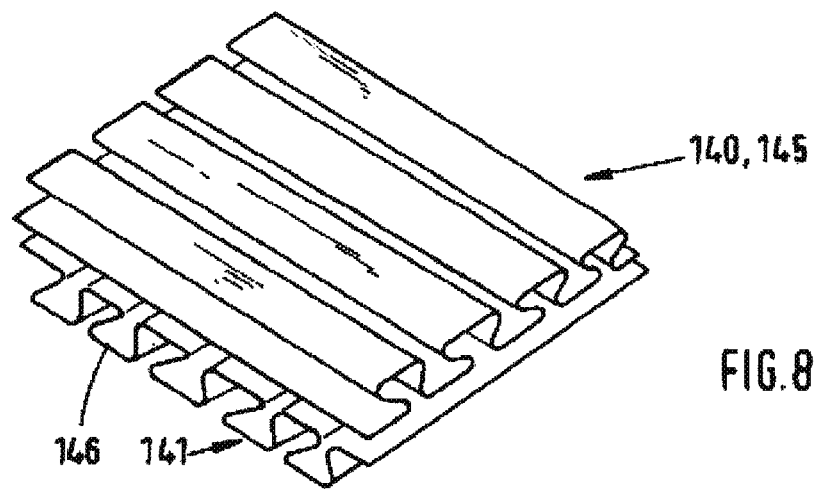

In appropriate fashion the distributor plates 145, 146 are able to bend in one direction and are stiff in another direction. This can for example be attained in that they are bent or curved in corrugated sheet fashion. In appropriate fashion the distributor plates of the hot and cold sides are turned 90° to each other (FIG. 8). By this means it is ensured that they will at most exert slight tensile stresses on each other. It can be appropriate to make the distributor plates 145, 146 of metal, to equip them with additional ribs, or to provide them with an elastic, conducting filler. Especially with this type, additional heat exchangers 140, 141 can be dispensed with, and this function can be assumed by the distributor plates 145, 146.

Semiconductor components 220 are appropriately situated so that they are placed along the ribs or the mountain & valley structure of the distributor plates 145, 146. This improves heat flux and minimizes stresses.

Provision can also be made that only the hot, or only the cold side, be provided with a distributor plate 145, 146. By this means likewise thermal stresses are lowered which are produced from the differing thermal expansion on the warm and cold sides.

To ensure that the semiconductor components 220 are electrically insulated against their environment, for such structures an insulating layer can be provided, for example in the form of a polymeric film and/or dual-sided adhesive strip between heat exchanger 140 and the semiconductor components 220. Such an insulating layer can simultaneously cover bridging devices. For that, we recommend that the insulating layer have abdomen-like meanders or bends between the various bridging devices, to prevent stresses.

However, a separate insulating layer for each bridging element can be provided. For both purposes, layerings with a dielectric are appropriate, which are sprayed on, printed on, rubbed in, sputtered, etc. Especially suitable as material components are paint, enamel, cement, rubber, etc.

Preferably between at least one electrothermal converter 112 and at least one distributor plate 145, 146 and/or one heat exchanger 140, 141, at least one connection zone 230 is provided, on which the electrothermal converter 112 is connected with the heat exchanger 140, 141 or the distributor plate 145, 146 or the distributor plate 145, 146 with at least one of the two other components.

The bridging elements 200 a-g can be connected with the heat exchangers 140, 141 and/or the distributor plates 145, 146 in the same way as between the bridge elements 200 and the semiconductor components 220. Preferably the connection is manufactured at least in part from an artificial resin, epoxy adhesive and/or indium solder. Since these materials at least to a certain extent allow a stretching of the electrothermal converter 112 or of the heat exchanger 140, 141, a large-area or full-area attachment of the connection zone 230 between the distributor plates 145, 146 and the electrothermal converter 112 or the heat exchanger 140, 141 is a possibility, even if the heat exchanger 140, 141 is made of copper and the distributor plates 145, 146 are made of ceramic.

Now in what follows, various versions are described, to give the semiconductor components 220 an opportunity to follow thermal expansion movements and at the same time to obtain a fixed temperature control element.

It is decisive that the warm side of a semiconductor component 220 obtains the possibility to arch up in its middle and the cold side can at least slightly raise its edge areas. For that it is appropriate that at least two of the components of the temperature control device 110 and/or of the electrothermal converter 112 be only partially bonded with each other.

Version a) We securely glue a point in the center of the semiconductor components 220 on the bridging elements of the hot side of the temperature control device 110. If the point is small enough, the semiconductor component 220 can bend away from the hot side, even if the adhesive is hard and non-elastic. The zone of adhesive bonding zone 230 may be in the middle or on the edge. It preferably constitutes less than 70% of the basic surface of semiconductor component 220, preferably less than 55% or 30%.

On the opposite cold side 114, the semiconductor components 220 are glued pointwise or over the full surface with the bridging element. However, in this area they are not provided with full-surface attachment on the ceramic plates, but rather at least in part are not attached there—preferably not at all. At best they are connected only at zones between the individual semiconductor components 220 with the ceramic plate. By this means, the edges of the semiconductor components facing the cold side 114 obtain a possibility to move toward one another and the inner area of the base surface can lift off from the cold side 114. The bridging elements can for example be reinforced by foils or textiles, for example with components of polymers like polyurethane and/or metals.

Version b) The semiconductor components 220 are glued on the hot side 115 on a ring and/or frame, which in the middle has a planar recess into which the semiconductor component 220 can warp during heating and expansion.

On the cold side 114, the semiconductor component 220 lies in the middle on a raised surface so that on the edges it has an encircling gap. This gives play to the semiconductor component 220, to bend with its cooling, contracting areas toward the cold side 114. Here it is advantageous if the ring, frame and/or the raised surface are formed at least in part from the jumper material, from soldered, welded or sintered metal and/or from electrically and/or thermally conducting adhesive.

Version c) We glue the semiconductor component only on one edge on the hot ceramic plate. We also securely glue the semiconductor component cold side only on one edge on the cold ceramic plate, but the two edges lie at ends of the semiconductor component 220 that lie opposite each other. Then the semiconductor component 220 has play if it moves the ceramic plate somewhat to the side and upwards.

The temperature control device 110 preferably is in an air conditioner. There a first air stream is directed along the one side of the temperature control device 110. By this means it absorbs heat, for example. If heating is to be done, then this heated stream is fed to the user. A second air stream runs past the opposite heat exchanger 140, 141. There it releases its thermal energy to the heat exchanger and is cooled thereby. If cooling is to be done, this air stream is fed to the user.

REFERENCE SYMBOLS

100 Air conditioner
110 Temperature control device
112 Electrothermal converter
114 Cold side
115 Warm side
119 Connecting cable
120 Air ducting device
130 Moisture regulator device
140 Heat exchanger, cold side
141 Heat exchanger, warm side
145, 146 Distributor plates
150 Current source
200 *a-g* Bridge elements
220 *a-f* Semiconductor components
230 *a-c* Connection zone
400 Bolster
500 cover
1000 Vehicle
1100 Interior item
1110 seat
1120 Steering wheel
1130 Dashboard
1140 Armrest
1150 Door panel
1160 Seat support
1170 Thermal cover
1180 Vehicle headliner

The invention claimed is:

1. A temperature controller comprising:
   A) two or more heat exchangers, each having at least one inward bend and at least one outward bend;
   B) an electrothermal converter which has a cold side and a warm side, the electrothermal converter having,
      (i) two or more electrical semiconductor components at least partially joined to and connected by at least one bridge element;
      (ii) one or more distributor plates between at least two of the two or more heat exchangers and at least two of the two or more electrical semiconductor components;
   wherein at least two of the two or more heat exchangers are on a same side of at least one of the one or more distributor plates and are situated at intervals next to each other, and
   wherein the at least one of the one or more distributor plates is flexible in one direction and is inflexible in another direction.

2. A temperature controller according to claim 1, wherein the at least two of the two or more heat exchangers situated at intervals next to each other have mobility relative to each other and exert no forces on each other.

3. A temperature controller according to claim 1, wherein the two or more heat exchangers are located on the cold side of the electrothermal converter.

4. A temperature controller according to claim 3, wherein at least one of the at least one bridge elements is connected with at least one of the one or more distributor plates.

5. A temperature controller according to claim 4, wherein the at least one of the at least one bridge elements is connected to the at least one of the one or more distributor plates on the warm side; and
   wherein there are no bridge elements located on the cold side.

6. A temperature controller according to claim 2, wherein at least one of the one or more distributor plates insulates at least two of the two or more electrical semiconductor components from at least two of the two or more heat exchangers.

7. A temperature controller according to claim 6, wherein at least one of the one or more distributor plates is located on the cold side of the electrothermal converter and is in contact with and bridges at least two of the two or more electrical semiconductor components.

8. A temperature controller according to claim 1, wherein the at least two of the two or more electrical semiconductor components are glued pointwise or over a full surface with at least one of the at least one bridge elements.

9. A temperature controller comprising:
A) two or more heat exchangers;
B) an electrothermal converter with a cold side and a warm side, the electrothermal converter having:
   (i) one or more pairs of electrical semiconductor components at least partially joined to and connected by at least one bridge element;
   (ii) one or more distributor plates between at least one of the two or more heat exchangers and at least one pair of the one or more pairs of electrical semiconductor components;
wherein at least one of the one or more distributor plates is flexible in one direction and is inflexible in another direction; and
wherein at least two of the two or more heat exchangers are on a same surface of at least one of the one or more distributor plates and situated at intervals next to each other so that the at least two of the two or more heat exchangers have relative mobility relative to each other and exert no forces on each other.

10. A temperature controller according to claim 9, wherein the at least two of the two or more heat exchangers on the same surface of the at least one of the one or more distributor plates have a corrugated-sheet structure, a rib structure, u-shape profile bends, or a combination thereof.

11. A temperature controller according to claim 10, wherein at least one of the at least one bridge elements is connected with at least one of the one or more distributor plates.

12. A temperature controller according to claim 11, wherein the two or more heat exchangers are located only on the cold side of the electrothermal converter.

13. A temperature controller according to claim 12, wherein at least one of the one or more distributor plates is a cold side distributor plate located between the two or more heat exchangers and at least one of the one or more pairs of electrical semiconductor components.

14. A temperature controller according to claim 13, wherein the cold side distributor plate insulates and bridges at least one pair of the one or more pairs of electrical semiconductor components from the two or more heat exchangers.

15. A temperature controller according to claim 14, wherein at least one of the one or more distributor plates is a warm side distributor plate located opposite of the cold side distributor plate.

16. A temperature controller according to claim 15, wherein the at least one of the at least one bridge elements is attached to the warm side distributor plate.

17. A temperature controller according to claim 16, wherein at least one of the at least one bridge element is connected to at least one pair of the one or more pairs of electrical semiconductor components by a bonding zone which is elastic and/or capable of creep.

18. A temperature controller according to claim 9, wherein at least one of the one or more distributor plates is a cold side distributor plate and at least one of the one or more distributor plates is a warm side distributor plate; and
wherein the warm side distributor plate is more elastic than the cold side distributor plate.

19. A temperature controller comprising:
A) two or more cold side heat exchangers having a corrugated-sheet structure, ribs, u-shape profile bends, or a combination thereof;
B) an electrothermal converter with a cold side and a warm side, the electrothermal converter having:
   (i) one or more pairs of electrical semiconductor components;
   (ii) at least one cold side distributor plate between at least one of the two or more cold side heat exchangers and the one or more pairs of electrical semiconductor components;
   (iii) at least one warm side distributor plate; and
   (iv) at least one bridge element between the one or more pairs of electrical semiconductor components and the warm side distributor plate;
wherein at least two of the two or more cold side heat exchangers are situated at intervals next to each other so that the at least two of the two or more cold side heat exchangers have relative mobility relative to each other and exert no forces on each other; and
wherein at least one of either the warm side distributor plate or the cold side distributor plate is flexible in one direction and is inflexible in another direction.

* * * * *